US007788444B2

(12) United States Patent
Lee et al.

(10) Patent No.: US 7,788,444 B2
(45) Date of Patent: Aug. 31, 2010

(54) MULTI-HIT DETECTION IN ASSOCIATIVE MEMORIES

(75) Inventors: Michael J. Lee, Austin, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 11/609,464

(22) Filed: Dec. 12, 2006

(65) Prior Publication Data

US 2008/0140925 A1    Jun. 12, 2008

(51) Int. Cl.
*G06F 13/00* (2006.01)
*G06F 13/28* (2006.01)
*G11C 15/00* (2006.01)

(52) U.S. Cl. .................................. 711/108; 365/49.17
(58) Field of Classification Search .................. 711/108
See application file for complete search history.

(56) References Cited

U.S. PATENT DOCUMENTS 5,893,931 A * 4/1999 Peng et al. .................. 711/206
7,092,270 B2   8/2006 Lee et al.
7,120,732 B2  10/2006 Braceras et al.
2002/0009009 A1 * 1/2002 Ahmed et al. ................ 365/207
2008/0140924 A1  6/2008 Lee et al.

OTHER PUBLICATIONS

U.S. Appl. No. 11/609,416, filed Dec. 12, 2006, Lee et al.
USPTO U.S. Appl. No. 11/609,416, Image File Wrapper printed from PAIR on Apr. 12, 2010, 2 pages.

* cited by examiner

*Primary Examiner*—Pierre-Michel Bataille
*Assistant Examiner*—Edward J Dudek
(74) *Attorney, Agent, or Firm*—Stephen J. Walder, Jr.; Diana R. Gerhardt (57) ABSTRACT

Mechanisms for multiple hit (multi-hit) detection in associative memories, such as a content addressable memory (CAM), are provided. The illustrative embodiments include a hit bitline that discharges as RAM side entries of the associative memory are accessed. The hit bitline is precharged high and pulled low by a series of devices that are activated as each RAM side row is accessed. As more RAM side rows are accessed, the hit bitline drops lower in voltage. The hit bitline drives an inverter with a threshold set such that any voltage equal to or lower than the threshold indicates a multi-hit situation. Any voltage higher than the threshold indicates a single hit or "no-hit" situation. Thus, from the voltage of the hit bitline, the presence of a multi-hit condition may be detected.

20 Claims, 7 Drawing Sheets

MULTI-HIT DETECTION IN ASSOCIATIVE MEMORIES

BACKGROUND

1. Technical Field

The present application relates generally to an improved data processing apparatus and method. More specifically, the present application is directed to an apparatus and method for multi-hit detection in associative memories, such as a content addressable memory (CAM).

2. Description of Related Art

A content addressable memory (CAM) is a type of associative memory having an individual logic circuit associated with each memory cell or CAM entry. The individual logic circuits of each memory cell allow for simultaneously comparing the contents of each memory cell of the CAM in a single memory cycle. Because the entire contents of the CAM memory can be searched in one memory cycle, such memories may perform fast searches. CAM memory is especially useful for cache memory as a lookup table to point to an information location for information stored in conventional RAM (random access memory) memory, for example.

Figure 1:
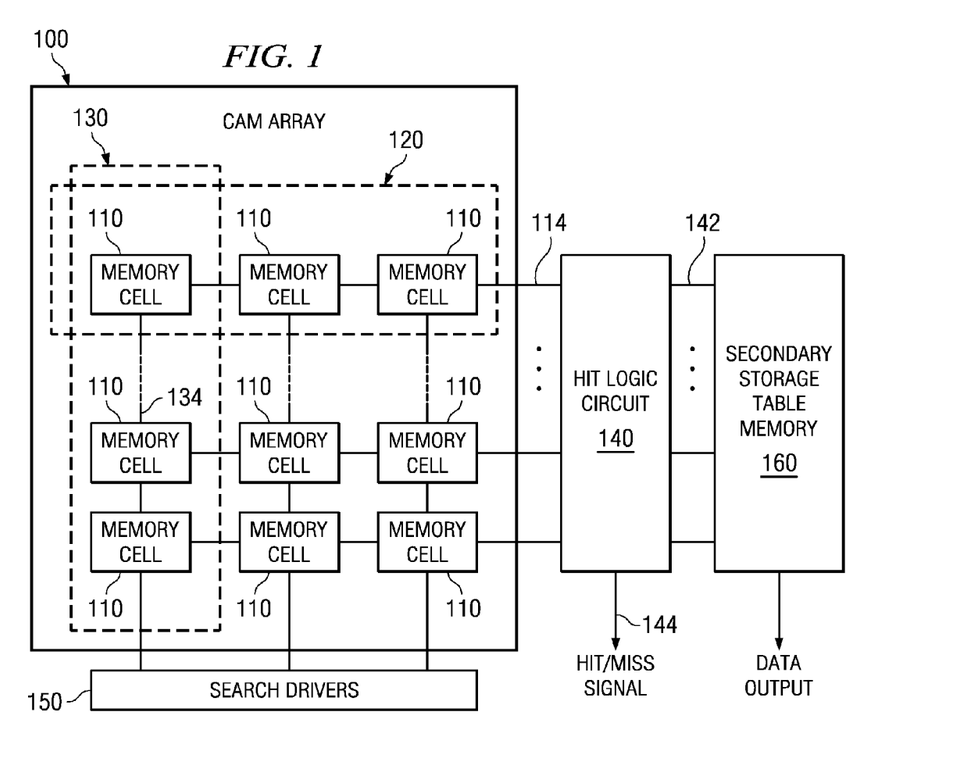
FIG. 1 is an exemplary block diagram of CAM array in accordance with a known architecture.

FIG. 1 illustrates an example of a known CAM array 100 comprising multiple memory cells 110. The CAM array 100 may be used for various purposes in which quick searching of multiple entries is desirable. For example, CAM arrays are typically used to provide address translation or address resolution, such as for cache accesses.

The memory cells 110 are arranged as an array having rows 120 and columns 130. The rows 120 of the CAM array 100 may sometimes be referred to as "word lines." The memory cells 110 in a particular row 120 are connected to one another by a match line 114. The match lines 114 of each row 120 are also connected to a hit logic circuit 140 which receives the output from the rows of memory cells 110 and determines which rows result in a match or "hit." The memory cells 110 in a particular column 130 are connected to one another by search lines 134. The search lines 134 couple the output of the search drivers 150 to the input of the memory cells 110. An output 142 of the hit logic circuit 140 is connected to the input of a secondary storage table memory 160, which may be a RAM, SRAM, or the like, which receives the outputs from the hit logic circuit 140 and outputs a corresponding data entry. The hit logic circuit 140 may also output a hit/miss signal 144 to indicate whether there was a hit detected or not.

In operation, the match lines 114 are pre-charged to a high state in preparation for a next search cycle. The search drivers 150 input the search data into the CAM array 100 through the search lines 134. This search data may be, for example, an input address for address translation or resolution. If the memory cell 110 does not contain the target data, the memory cell 110 causes its associated match line 114 to discharge to ground. If the contents of a particular cell 110 match the applied data received, along its search line 134, the memory cell 110 will allow its match line 114 to remain high. Thus, if all the memory cells 110 in a row 120 match the search data received on the search lines 134, the match line 114 of that row 130 remains high indicating a match. Otherwise, the match line 114 is discharged to ground indicating a mismatch or miscompare, in at least one of the cells 110 on the match line 114.

Based on the particular row 120 in the array 100 that that indicates a "hit," a corresponding row in the secondary storage table memory 160 is selected. That is, the data in the secondary storage table memory 160 may be indexed by the stored address table represented by the CAM array 100. The corresponding data in the secondary storage table memory 160 may then be output for use by the computing system in which the CAM array 100 is present. This is referred to as a "match read." The above operation may then be repeated for the next search cycle.

As noted above, a benefit of a CAM array is its ability to search all entries simultaneously. For example, a CAM array that has 1K entries can be searched in one cycle, while a standard memory (SRAM or DRAM) would typically require 1000 cycles to determine if the desired data is present.

However, one limitation of CAM systems is that, at most, only one word line stored in the device should be matched at a time. Nevertheless, a significant problem with existing CAM devices is that a circuit failure or software error external to the CAM device can cause the occurrence of multiple "hits." For example, in devices used in certain environments, radiation may cause soft error rate (SER) failures of the CAM device. As one example, alpha particles that are typically filtered out by Earth's atmosphere, may cause SER failures of CAM devices in applications where such filtering is not possible, such as in satellites, space vehicles, and other devices intended for use outside of Earth's atmosphere or at very high altitudes.

If a multiple hit condition exists, multiple word-lines are enabled in the CAM device and erroneous outputs are returned. That is, multiple data entries in the secondary storage table memory 160 are simultaneously accessed causing the resulting data output to be invalid. Even worse, data corruption in the secondary storage table memory 160 may result if the access involves shared read/write bitlines.

Thus, it is important to be able to detect the occurrence of a multiple hit condition in a CAM device. A known solution for detecting the multiple hit condition in a CAM device is to use a system of logical XOR gates to detect the multiple hit condition. With this known solution, each row in the secondary storage table memory 160, i.e. the RAM side of the CAM structure, is assigned a unique address. This address and its complement are stored in a ROM table (not shown). Whenever there is a "hit" in the CAM array 100, i.e. the CAM side of the CAM structure, the corresponding address and its complement are accessed along with the stored data in the secondary storage table memory 160. If only one entry from the RAM side is accessed, an XOR of each returned address bit and its complement should result in a logic "1" for each address position. If more than one RAM side entry is accessed, the per bit XOR will not result in a logic "1" for each bit position. In this way, a multiple hit in the CAM array 100 may be detected.

While this solution provides a useful mechanism for detecting a multiple hit condition in a CAM structure, the solution requires the addition of a ROM table and its associated circuitry for multiple hit condition detection. In systems where chip area is of concern, the addition of such circuitry and logic causes a decrease in the available area for other functional logic. Moreover, the additional logic and circuitry requires additional power to operate. Furthermore, the solution increases the delay associated with CAM accesses because the solution requires one ROM access, one XOR, and one AND stage of delay in order to perform the multiple hit detection.

SUMMARY

The illustrative embodiments provide an apparatus and method for multiple hit (multi-hit) detection in associative memories, such as a content addressable memory (CAM). The mechanisms of the illustrative embodiments include a hit bitline that discharges as RAM side entries of the associative memory are accessed. The hit bitline is precharged high and pulled low by a series of devices that are activated as each RAM side row is accessed. As more RAM side rows are accessed, the hit bitline drops lower in voltage. The hit bitline drives an inverter with a threshold set such that any voltage equal to or lower than the threshold indicates a multi-hit situation. Any voltage higher than the threshold indicates a single hit or "no-hit" situation. Thus, from the voltage of the hit bitline, the presence of a multi-hit condition may be detected.

In one illustrative embodiment, a method for detecting a multiple hit condition in an associative memory is provided. The method may comprise precharging a hit bitline associated with the associative memory to a high voltage level and adjusting a voltage of the hit bitline with each determined match of compare data to data stored in wordlines of the associative memory. The method may further comprise detecting a multiple hit condition in the associative memory when the voltage of the hit bitline has a predetermined relationship with a threshold voltage.

The method may also comprise providing the compare data to the associative memory, comparing the compare data to data stored in each wordline of the associative memory, and outputting a signal to access a secondary storage table memory for wordlines in which the compare data matches the data stored in the wordline. The voltage of the hit bitline may be reduced with each determined match of the compare data to the data stored in the wordline. The predetermined relationship may be one in which the voltage of the hit bitline is equal to or less than the threshold voltage.

The voltage of the hit bitline may be reduced by way of one or more transistors coupled to wordlines of the associative memory and the hit bitline. The method may comprise independently modulating a duration for which a transistor in the one or more transistors is active. The duration for which the transistor is independently modulated may be controlled by way of a pulse generator.

The method may further comprise adjusting the threshold voltage to compensate for PVT affects of the one or more transistors coupled to the wordlines and the hit bitline. The threshold voltage may be adjusted using at least one inverter.

The method may further comprise invalidating data read from a secondary storage table memory in response to detecting the multiple hit condition in the associative memory. Moreover, the method may comprise invalidating wordlines in the associative memory that contribute to the multiple hit condition in response to detecting the multiple hit condition in the associative memory.

In yet another illustrative embodiment, an apparatus comprising an array of memory cells and a hit bitline coupled to the array of memory cells is provided. The hit bitline may be precharged to a high voltage level. A voltage of the hit bitline may be adjusted with each determined match of compare data to data stored in wordlines of the array of memory cells. A multiple hit condition may be detected in the array of memory cells when the voltage of the hit bitline has a predetermined relationship with a threshold voltage.

The compare data may be provided to the array of memory cells and may be compared to data stored in each wordline of the array of memory cells. A signal to access a secondary storage table memory for wordlines in which the compare data matches the data stored in the wordline may be output. The voltage of the hit bitline may be reduced with each determined match of the compare data to the data stored in the wordline. The predetermined relationship may be one in which the voltage of the hit bitline is equal to or less than the threshold voltage.

The voltage of the hit bitline may be reduced by way of one or more transistors coupled to wordlines of the array of memory cells and the hit bitline. A duration for which a transistor in the one or more transistors is active may be independently modulated. The duration for which the transistor is independently modulated may be controlled by way of a pulse generator.

The threshold voltage may be adjusted to compensate for PVT affects of the one or more transistors coupled to the wordlines and the hit bitline. The threshold voltage may be adjusted using at least one inverter.

Data read from a secondary storage table memory may be invalidated in response to detecting the multiple hit condition in the array of memory cells. Wordlines in the array of memory cells that contribute to the multiple hit condition may be invalidated in response to detecting the multiple hit condition in the array of memory cells.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide an apparatus and method for transparent multiple hit detection in associative memories, such as a content addressable memory (CAM). Such associative memories have various uses depending upon the data processing device in which they are utilized. It is not possible to detail every possible use of an associative memory herein. As one example, however, such associative memories may be utilized in caches of processors in data processing devices. Moreover, such associative memories may be used to perform address translation or resolution in various input/output adapters, interfaces, or the like.

Figure 2:
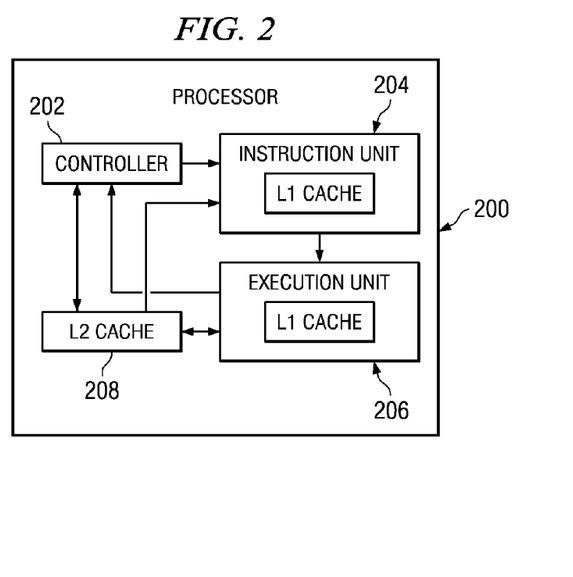
FIG. 2 is an exemplary block diagram of a processor in which an associative memory may be utilized in accordance with one illustrative embodiment.

FIG. 2 is provided as one example of a data processing environment in which an associative memory may be utilized, i.e. in a cache of a processor. FIG. 2 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which an associative memory may be utilized is intended to be within the spirit and scope of the present invention.

Referring now to FIG. 2, an exemplary block diagram of a processor 200 is provided in accordance with one illustrative embodiment. Processor 200 includes controller 202, which controls the flow of instructions and data into and out of processor 200. Controller 202 sends control signals to instruction unit 204, which includes an L1 cache. Instruction unit 204 issues instructions to execution unit 206, which also includes an L1 cache. Execution unit 206 executes the instructions and holds or forwards any resulting data results to, for example, L2 cache 208. In turn, execution unit 206 retrieves data from L2 cache 208 as appropriate. Instruction unit 204 also retrieves instructions from L2 cache 208 when necessary. Controller 202 sends control signals to control storage or retrieval of data from L2 cache 208. Processor 200 may contain additional components not shown, and is merely provided as a basic representation of a processor and does not limit the scope of the present invention.

Those of ordinary skill in the art will appreciate that the hardware in FIG. 2 may vary depending on the implementation. Other internal hardware or peripheral devices, such as flash memory, equivalent non-volatile memory, or optical disk drives and the like, may be used in addition to or in place of the hardware depicted in FIG. 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The L1 cache and L2 cache 208 may be implemented using an associative memory, such as a content addressable memory (CAM), for example. Addresses may be supplied to the associative memory in which case every wordline of the associative memory is searched simultaneously to determine if any of the wordlines match the supplied address, i.e. there is a "hit" in the associative memory. If there is a match, a corresponding entry in the L1 or L2 cache 208 is read out and provided to an appropriate unit in the processor 200.

As mentioned above, in certain circumstances, multiple hits may occur in the associative memory due to external software errors, circuitry failures, or the like. The illustrative embodiments provide an apparatus and method for multiple hit (multi-hit) detection in associative memories, such as a content addressable memory (CAM). The mechanisms of the illustrative embodiments include a hit bitline that discharges as RAM side entries of the associative memory are accessed. The hit bitline is precharged high and pulled low by a series of devices that are activated as each RAM side row is accessed. As more RAM side rows are accessed, the hit bitline sinks lower in voltage. The hit bitline drives an inverter with a threshold set such that any voltage equal to or lower than the threshold indicates a multi-hit situation. Any voltage higher than the threshold indicates a single hit or "no-hit" situation. Thus, from the voltage of the hit bitline, the presence of a multi-hit condition may be detected.

Figure 3:
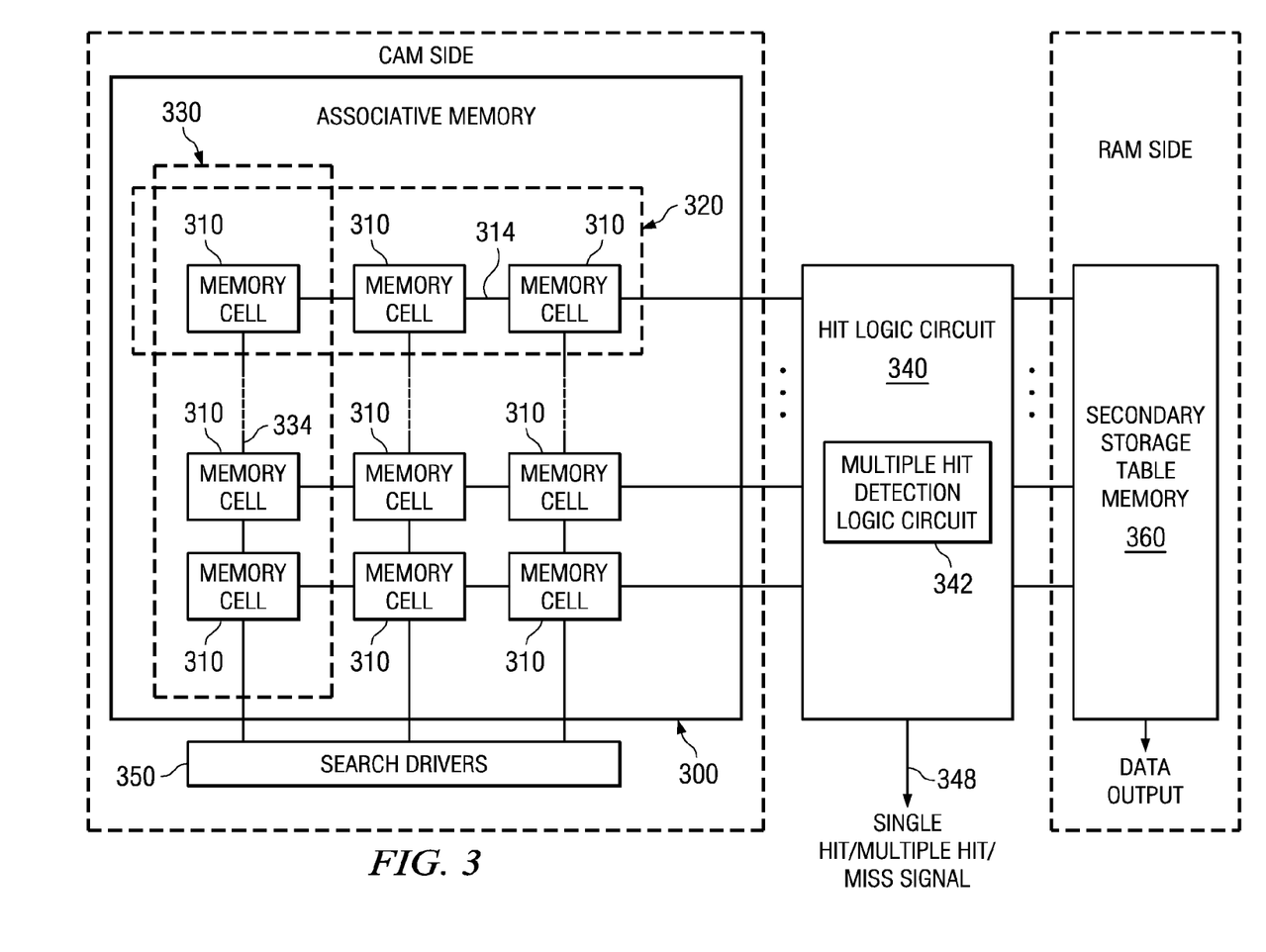
FIG. 3 is an exemplary block diagram of an associative memory structure in accordance with one illustrative embodiment.

FIG. 3 is an exemplary block diagram of an associative memory structure in accordance with one illustrative embodiment. In the depicted example, the associative memory structure is a content addressable memory (CAM), however the invention is not limited to such and any associative memory may be utilized. Thus, while FIG. 3 depicts a "CAM side" and a "RAM side" of the associative memory structure, it should be appreciated that other types of associative memories, other than CAMs, may be used with the mechanisms of the illustrative embodiments without departing from the spirit and scope of the present invention.

As shown in FIG. 3, an associative memory 300 is comprised of a plurality of memory cells 310 arranged as an array having rows 320 and columns 330. The rows 320 of the associative memory 300 may sometimes be referred to as "word lines." The memory cells 310 in a particular row 320 are connected to one another by a match line 314. The match lines 314 of each row 320 are also connected to a hit logic circuit 340 which itself includes multiple hit detection logic circuit 342 in accordance with the illustrative embodiments, as described hereafter.

The hit logic circuit 340 receives the output from the rows, i.e. wordlines, of memory cells 310 and determines which rows result in a match or "hit." The hit logic circuit 340 further determines, via the multiple hit detection logic circuit 342, if there is a multiple hit condition in the wordlines of the associative memory 300.

The memory cells 310 in a particular column 330 are connected to one another by search lines 334. The search lines 334 couple the output of the search drivers 350 to the input of the memory cells 310. An output 346 of the hit logic circuit 340 is connected to the input of a secondary storage table memory 360, which may be a RAM, SRAM, or the like, which receives the outputs from the hit logic circuit 340 and outputs a corresponding data entry. The hit logic circuit 340 may also output a hit/multi-hit/miss signal 348 to indicate, to the data processing device in which the associative memory 300 is provided, whether there was a hit detected, whether multiple hits were detected, of whether no hit was detected. If the hit/multi-hit/miss signal 348 indicates a multi-hit condition, the data processing device may, for example, invalidate the data retrieved from the secondary storage table memory 360 and/or perform other operations for avoiding corruption of data in the data processing system.

In operation, the match lines 314 are pre-charged to a high state in preparation for a next search cycle. The search drivers 350 input the search data into the associative memory 300 through the search lines 334. This search data may be, for example, an input address for address translation or resolution. If the memory cell 310 does not contain the target data, the memory cell 310 causes its associated match line 314 to discharge to ground. If the contents of a particular cell 310 match the applied data received, along its search line 334, the memory cell 310 will allow its match line 314 to remain high. Thus, if all the memory cells 310 in a row 320 match the search data received on the search lines 334, the match line 314 of that row 330 remains high indicating a match. Otherwise, the match line 314 is discharged to ground indicating a mismatch or miscompare, in at least one of the cells 310 on the match line 314.

Based on the particular row 320 in the array 300 that indicates a "hit," a corresponding row in the secondary storage table memory 360 is selected. That is, the data in the secondary storage table memory 360 may be indexed by the stored address table represented by the associative memory 300. This secondary storage table memory 360 may be, for example, a RAM, SRAM, or the like, and may be used to store data for caching purposes, for address translation purposes, or any other purpose for which an associative memory 300 may be desirable to use. The corresponding data in the secondary storage table memory 360 may be output for use by the data processing device in which the associative memory 300 is present. This is referred to as a "match read." The above operation may then be repeated for the next search cycle.

In the above process for identifying hits in the associative memory 300, the hit logic circuit 340 further determines if multiple hits have occurred. That is, multiple hit detection logic circuit 342 determines if more than one wordline in the associative memory 300 remains high. If so, the hit logic circuit 340 outputs a multiple hit output signal 348 to the data processing device to inform the data processing device that the output from the secondary storage table memory 360 is invalid. The data processing device may then perform necessary operations for invalidating the data read from the secondary storage table memory 360. Such invalidation of the associative memory structure is generally known in the art and thus, a detailed explanation of these processes is not provided herein.

In addition to invalidating the data read from the secondary storage table memory 360, other operations may be performed for ensuring that such multiple hit conditions with regard to these wordlines in the associative memory are minimized. For example, the associative memory may be reloaded with valid data in order to avoid a subsequent multiple hit condition. Such reloading operations are generally known in the art and thus, a detailed explanation of these processes is not provided herein.

Moreover, operations may be performed by the hit logic circuit 340 to invalidate individual wordlines in the associative memory 300 in accordance with co-pending and commonly assigned U.S. patent application Ser. No. 11/609,416, filed on common date herewith, and hereby incorporated by reference. With such a mechanism, validity bit storage devices (not shown) may be provided after the wordlines of the associative memory 300 but prior to the hit logic circuit 340. The validity bit storage devices may be set by logic provided in the hit logic circuit 340 that sets the validity bit storage devices of wordlines that are part of a detected multi-hit condition.

In such an arrangement, each wordline may still perform the compare operation but those wordlines that have been set to an invalid state by the value stored in their associated validity bit storage device will not be considered by the hit logic circuit 340 when determining if a hit has occurred or not. Moreover, in another illustrative embodiment, the validity bit storage device may be configured into the associative memory 300 such that the compare operation performed in the associative memory 300 is inhibited for those wordlines that have been determined to be invalid in previous search cycles. In this way, reloading of the associative memory structure may be delayed until a time where such reloading will not impact the performance of the data processing device but in the interim, additional multi-hit conditions with regard to those wordlines are not detected.

The multiple hit detection logic circuit 342 of the illustrative embodiments comprises a hit bitline and a precharge and detection circuit (not shown). The precharge and detection circuit precharges the hit bitline to a predetermined high voltage state. With each "hit" in the associative memory, the voltage of the hit bitline is reduced. When the voltage of the hit bitline is reduced below a predetermined threshold, the precharge and detection circuit detects a multiple hit condition. The precharge and detection circuit outputs a signal indicative of a single hit or "no hit" condition when the voltage of the hit bitline is greater than the predetermined threshold. The precharge and detection circuit outputs a signal indicative of a multi-hit condition when the voltage of the hit bitline is equal to or less than the predetermined threshold.

Figure 4:
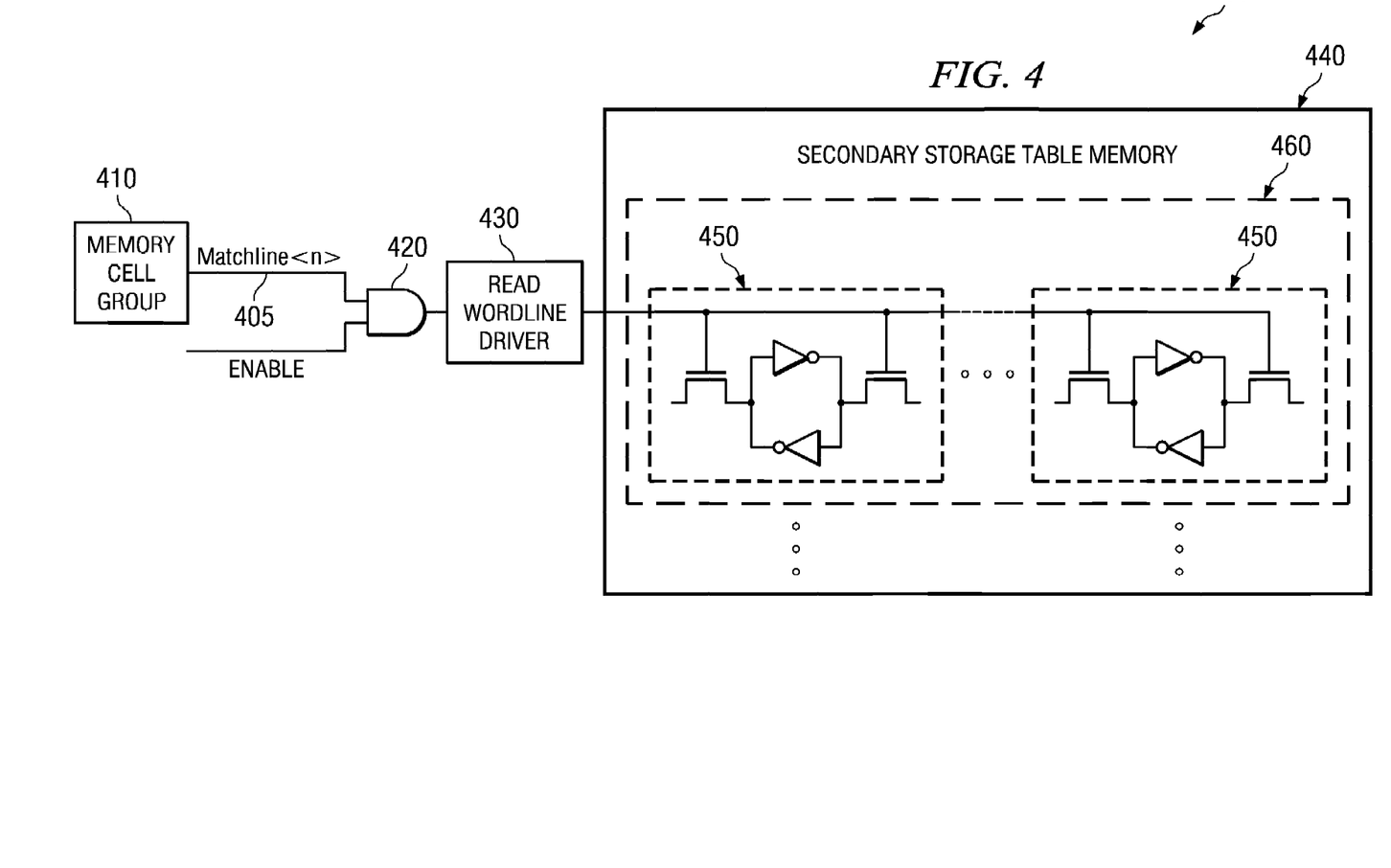
FIG. 4 is an exemplary diagram of a typical memory access structure in accordance with a known mechanism.

FIG. 4 is an exemplary diagram of a typical memory access structure in accordance with a known mechanism. As shown in FIG. 4, in a wordline 400 of an associative memory, such as a content addressable memory, the matchline output 405 of a group of memory cells 410 is input to an AND gate 420 along with an enable signal. As mentioned above, normally, the matchline output 405 is precharged to a logic high state before a compare action, and is cleared to a logic low state in the case of any bit mismatch during the comparison of bits in the memory cells of the wordline 400. The matchline output 405 remains high if the wordline's data entry matches the incoming compare data.

The AND gate 420 essentially AND's the enable signal with the matchline output 405 from the group of memory cells 410 and asserts a signal to the read wordline driver 430 in response to both the matchline and the enable signal being at a logic high state, i.e. a logic "1." The read wordline driver 430 drives a signal to the memory cells 450 of a corresponding entry 460 in the secondary storage table memory 440 to thereby cause the data values in the memory cells 450 of the corresponding entry 460 to output their values to the data processing device in which the memory access structure is provided.

Multiple ones of the memory access structure shown in FIG. 4 may be combined to provide an associative memory and its corresponding secondary storage table memory, i.e. the "CAM side" and the "RAM side" of an associative memory structure. Moreover, the mechanisms of the illustrative embodiments add to the structure shown in FIG. 4 a hit bitline, precharge and detection circuitry, and circuitry for driving down the voltage of the hit bitline with each "hit" generated in the associative memory. In this way, a multi-hit condition may be detected based on the voltage state of the hit bitline.

Figure 5:
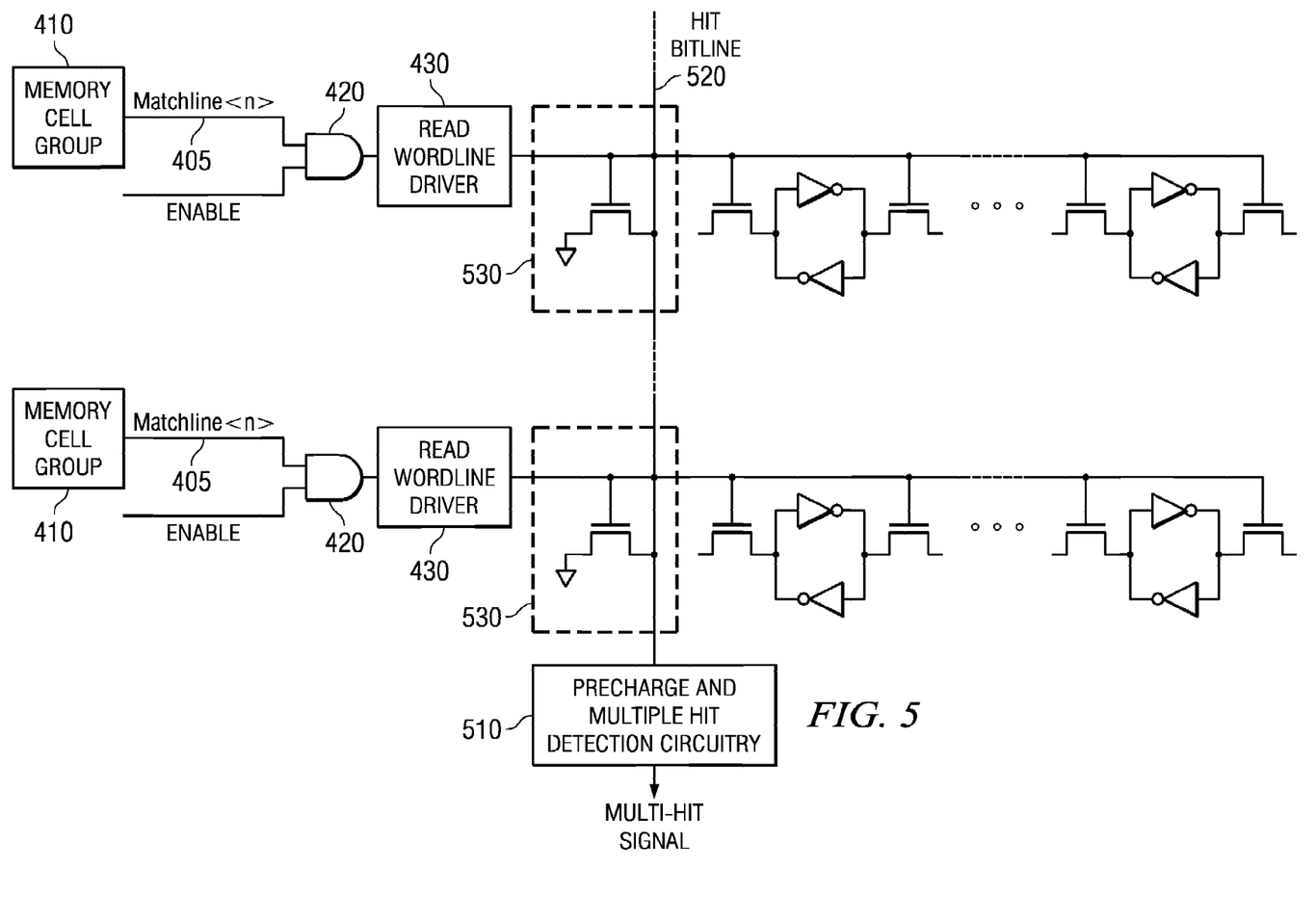
FIG. 5 is an exemplary diagram of a multiple hit detection mechanism in accordance with one illustrative embodiment, which may be used in conjunction with the memory access structure of FIG. 4.

FIG. 5 is an exemplary diagram of a multiple hit detection mechanism in accordance with one illustrative embodiment, which may be used in conjunction with the memory access structure of FIG. 4. As shown in FIG. 5, pre-charge and detection circuitry 510 is provided for pre-charging a hit bitline 520 to a logic high level (i.e. logic "1" state). The hit bitline 520 takes the output of the read wordline drivers 430 of each of the wordlines in the associative memory and provides a resulting signal to the pre-charge and detection circuitry 510.

With every read wordline driver that asserts a signal to read from the secondary storage table memory, the signal along the hit bitline 520 to the pre-charge and detection circuitry 510 is driven lower in voltage. This drop in voltage is made possible by way of the transistor elements 530, e.g., NFET elements 530. When this voltage drops to or below a predetermined level, a multiple hit condition may be detected by the precharge and detection circuitry 510. The detected multiple hit condition may then be communicated to the data processing device by asserting a multiple hit signal. If a multiple hit condition is not detected, the multi-hit signal may not be asserted by the precharge and detection circuitry 510, thereby indicating that a single hit or "no hit" condition is present.

The precharge and detection circuitry 510 need only have a device for precharging the hit bitline to a high state, i.e. a logic "1" state, and an inverter with an adjustable threshold for PVT compensation. For example, the precharge and detection circuitry may utilize a PMOS device to precharge the hit bitline and a set of PFETs and NFETs with associated inputs for adjusting the threshold of the inverter up or down to compensate for PVT variations. Such circuitry is shown in FIG. 6.

Figure 6:
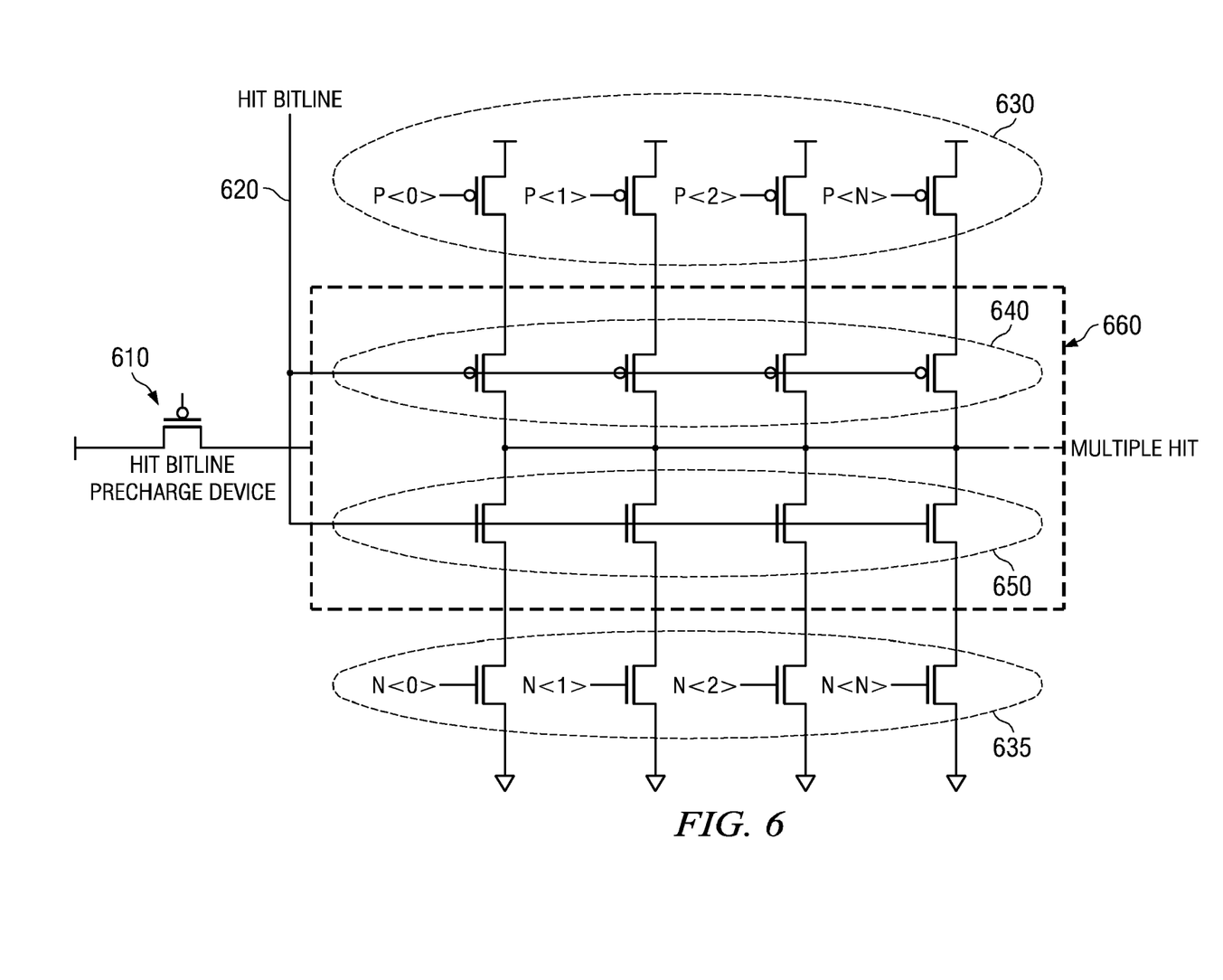
FIG. 6 is an exemplary circuit diagram of a precharge and detection circuitry device in accordance with one illustrative embodiment.

FIG. 6 is an exemplary circuit diagram of a precharge and detection circuitry device in accordance with one illustrative embodiment. As shown in FIG. 6, the hit bitline precharge device comprises a PMOS device 610 which precharges the hit bitline 620 to a high state every processor cycle. The inputs P<0:N> to the PFET devices 630 are used to adjust the threshold of the inverter 660 comprising PFETs 640 and NFETs 650. The inputs N<0:N> to the NFET devices 635 are used to pull the threshold of the inverter 660 down. The adjustment of the threshold is made so as to compensate for PVT variations in the transistor elements 530, e.g., NFETs 530 in FIG. 5, attached to the hit bitline 620.

It should be appreciated that the circuit shown in FIG. 6 is one large inverter with multiple inverters tied together in parallel. The hit bitline threshold voltage that will flip/switch this inverter can be controlled by activating/deactivating the P<0:N> and N<0:N> transistors 640 and 650 accordingly. In this way, the size of the PFET and NFET of the large inverter is controlled by activating/deactivating the P<0:N> and N<0:N> transistors 640 and 650.

With every processor cycle, the precharge device 610 precharges the hit bitline 620. With each "hit" in the associative memory, the corresponding NFET 530 of the wordline drives the voltage of the hit bitline 620 lower. When the voltage of the hit bitline is equal to or less than the threshold of the inverter 660, which has been adjusted for PVT variations by way of the inputs P<0:N> and N<0:N>, the inverter 660 inverts the low state signal to thereby assert a high state multi-hit signal. As a result, a multiple hit condition in the associative memory is communicated to the data processing device in which the circuitry of FIGS. 5 and 6 is provided.

Figure 7:
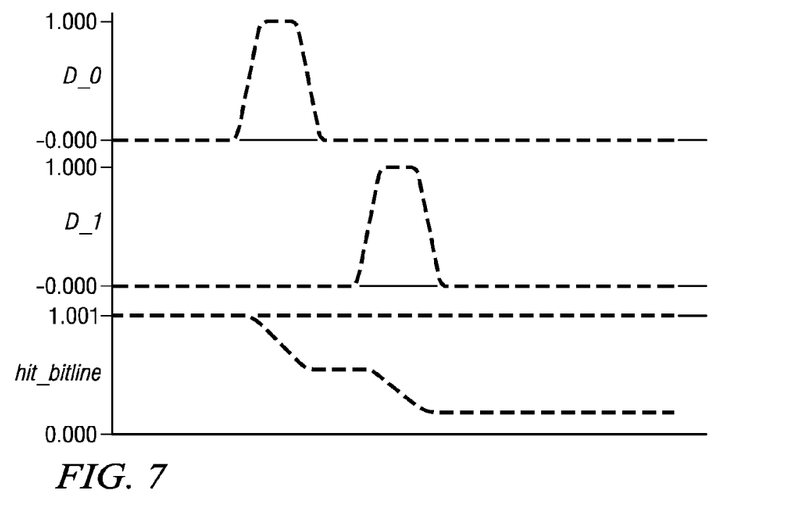
FIG. 7 is an exemplary plot depicting results of a simulation of a hit bitline in accordance with one illustrative embodiment.

FIG. 7 is an exemplary plot depicting results of a simulation of a hit bitline in accordance with one illustrative embodiment. The simulation results in FIG. 7 are for a simulation of a hit bitline with 32 entries in 60 nm technology. D_0 and D_1 are inputs at two of the hit bitline attached NFETs, i.e. NFETs 530. The logic "0" to logic "1" to logic "0" transitions represents a "hit" in a corresponding wordline of the associative memory where an entry in the associative memory matches the incoming compare data. D_0 and D_1 have been spaced apart in the figure to more clearly show the discharge effect to the hit bitline. In actuality, the NFET pulldowns would most likely activate virtually simultaneously but the discharge effect would be the same.

In the depicted example, the hit bitline voltage after one NFET pulldown activates is 550 mV. The hit bitline voltage after the second NFET pulldown activates is 185 mV. The inverter from the precharge and detection circuitry need only sense if the hit bitline voltage has dropped significantly below the 550 mV mark to register a multi-hit condition. The precharge and detection circuitry may have its voltage trigger point set to a value below the 550 mV mark but above the expected voltage generated by a second NFET pulldown, e.g., 250 mV. Thus, when the second NFET pulls down the voltage of the hit bitline to 185 mV, because this voltage of the hit bitline is less than the trigger point of 250 mV, the precharge and detection circuitry will trigger the assertion of the multi-hit signal.

Figure 8:
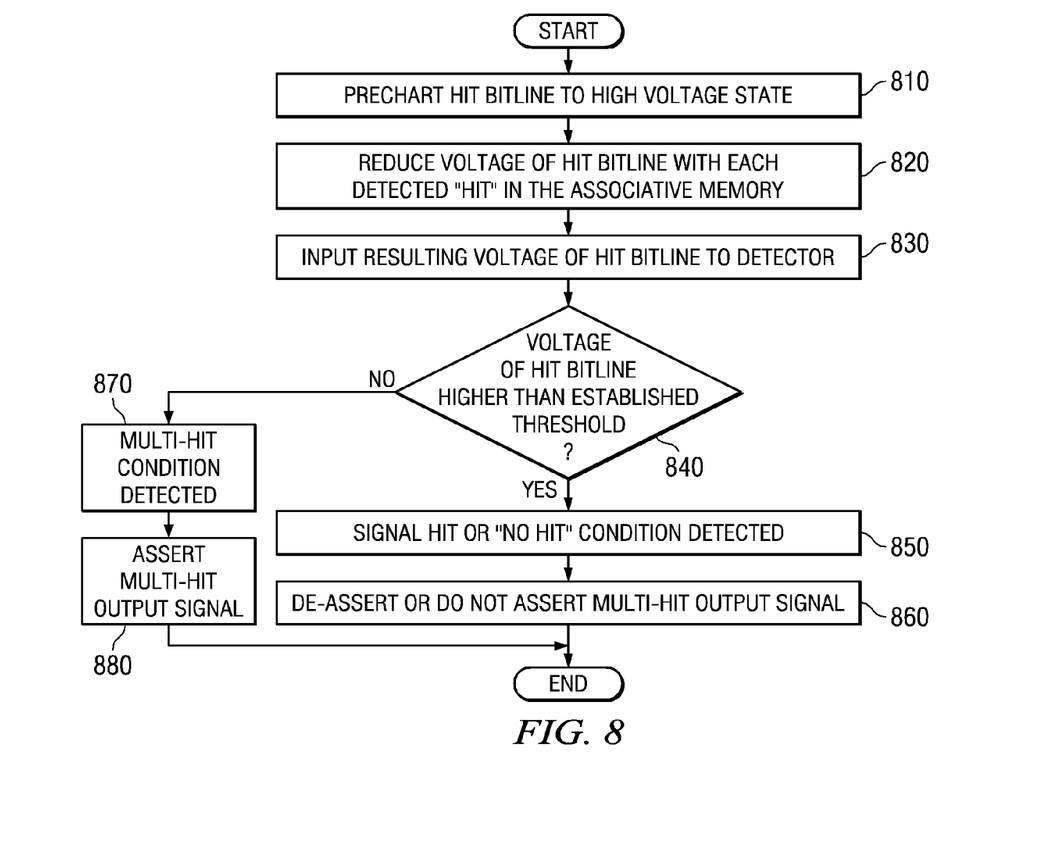
FIG. 8 is a flowchart outlining an exemplary operation of a multiple hit detection logic circuit in accordance with one illustrative embodiment.

FIG. 8 is a flowchart outlining an exemplary operation of a multiple hit detection logic circuit in accordance with one illustrative embodiment. As shown in FIG. 8, the operation starts with the hit bitline being precharged to a high level voltage state by a precharge device (step 810). Thereafter, with each "hit" detected in the associative memory, the voltage of the hit bitline is reduced (step 820). The resulting voltage of the hit bitline is input to detection circuitry (step 830). The detection circuitry determines if the voltage of the hit bitline is higher than an established threshold value (step 840). If the voltage of the hit bitline is higher than the established threshold value, then a single hit or "no hit" condition is detected (step 850) and a multi-hit output signal is not asserted (step 860). If the voltage of the hit bitline is not higher than the established threshold value, then a multi-hit condition is detected (step 870) and the multi-hit output signal is asserted (step 880). The operation then terminates.

It should be noted that while the operation of the multiple hit detection logic circuit terminates at this point, the data processing device in which the multiple hit detection logic circuit is provided may utilize the output of the multiple hit detection logic circuit to invalidate any data read from a secondary storage table memory associated with the associative memory. Moreover, as mentioned above, the data processing device may utilize the output to invalidate individual wordlines of the associative memory and/or initiate the reloading of the associative memory structure. The operation outlined in FIG. 8 may be repeated with each processor cycle.

Thus, the illustrative embodiments provide a mechanism by which a multiple hit condition in an associative memory may be detected. The mechanisms of the illustrative embodiments eliminate the need to add a ROM table, its corresponding circuitry, a plurality of XOR gates, and the like, as is required in the known multiple hit detection mechanisms. Thus, the illustrative embodiments reduce the chip area required for multiple hit detection circuit and the power consumption for such circuitry. Moreover, with the illustrative embodiments, a single logic stage delay is incurred by the multiple hit detection circuitry of the illustrative embodiments rather than the three or more stages of delay experienced in the known multiple hit detection mechanisms.

It should be appreciated that the multiple hit detection logic circuitry described above is only exemplary of the possible implementations of the illustrative embodiments. Many modifications to the depicted and described mechanisms may be made without departing from the spirit and scope of the present invention.

For example, it should be appreciated that the active time of the hit bitline attached NFET pulldown devices, e.g., the NFETs 530 in FIG. 5, may be critical to the operation of the illustrative embodiments. As shown in FIG. 5, the NFET pulldown is directly triggered by the RAM side wordline driver 430. However, this is only one possible implementation of the illustrative embodiments. If any one NFET pulldown device 530 is active too long, the voltage of the hit bitline 520 may drop to 0 volts and render multi-hit detection not possible.

This situation may occur under three conditions. Under a first condition, both the rising, or active, edge and the falling, or standby, edge of the wordline pulse are controlled by, i.e. is dependent on, the system clock. If the data processing device is run at a slower frequency, the wordline pulse will widen thereby causing the hit bitline attached NFET pulldown device 530 to stay active longer in the case of a wordline hit.

Under a second condition, only the active edge of the wordline driver pulse is dependent on the system clock and the standby edge is tuned to allow sufficient time for an entire RAM row, i.e. a row in the secondary storage table memory, to be accessed. The access time requirements take precedence over multi-hit detection requirements. If the RAM array is particularly wide, the wordline driver pulse will be tuned for a longer duration thus keeping the hit bitline attached NFET pulldown device 530 active for longer than desired.

Under a third condition, the capacitance of the hit bitline may be directly related to the number of entries stored in the associative memory. If the number of entries is too small, it may be very difficult to manufacture a device weak enough to avoid pulling the hit bitline all the way to 0 volts in a single row match case.

These three conditions may be addressed by providing a more robust implementation of the multi-hit detection logic circuitry of the illustrative embodiments. The least invasive modification to the circuitry previously described is to tune the RAM side wordline driver pulsewidth, hit bitline capacitance, and NFET pulldown strength to optimal values for multi-hit detection. However, this will service a small range of associative memory sizes and operational frequencies. A more versatile approach is to independently modulate the duration for which the NFET pulldown devices 530 are active. Such a modification to the illustrative embodiments is shown in FIG. 9.

Figure 9:
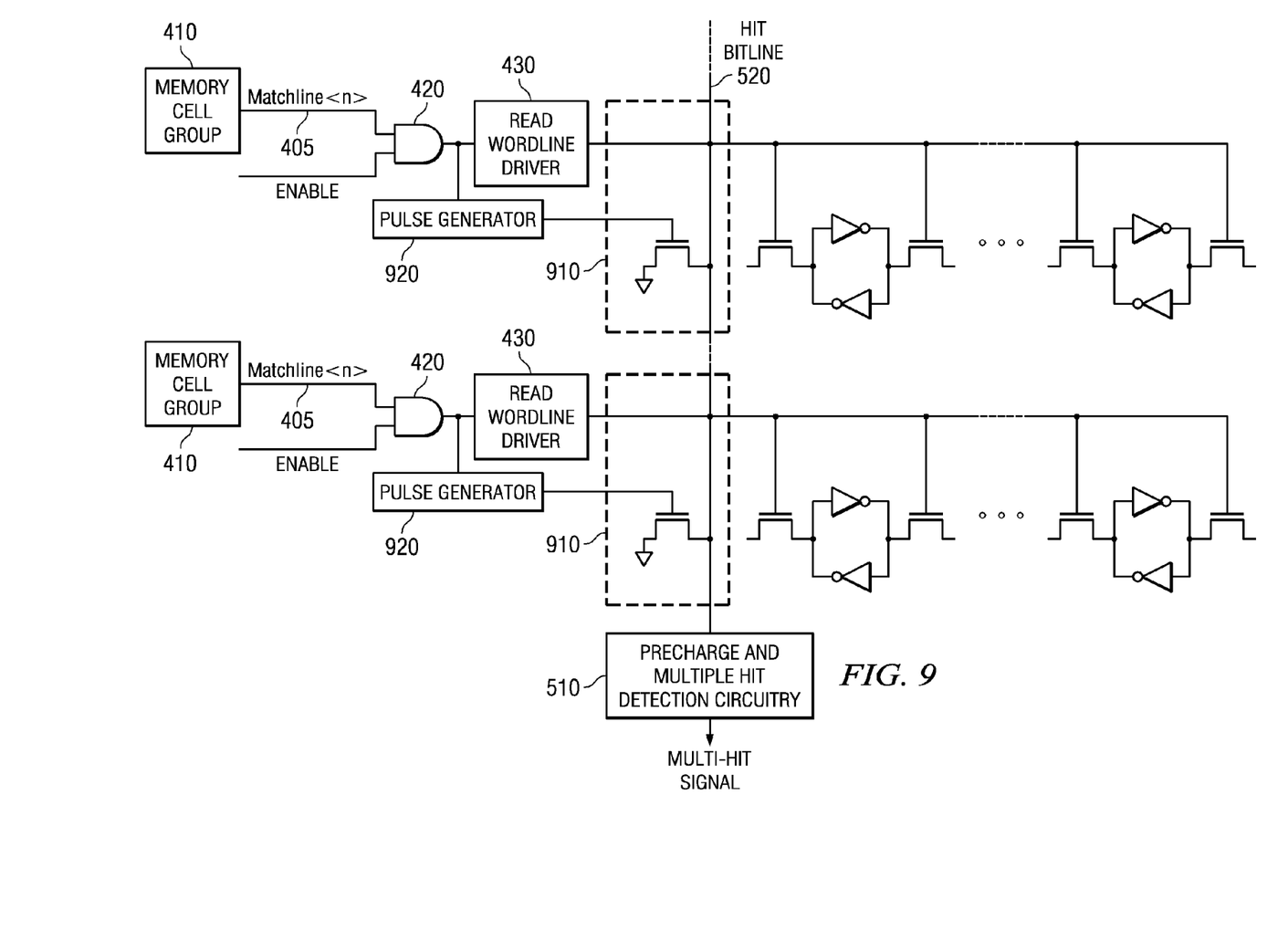
FIG. 9 is an exemplary diagram of an alternative illustrative embodiment in which the duration for which NFET pulldown devices are active is modulated independently.

FIG. 9 is an exemplary diagram of an alternative illustrative embodiment in which the duration for which NFET pulldown devices 530 are active is modulated independently. As shown in FIG. 9, when compared to FIG. 5, rather than driving the NFET pulldown device 910 with the output of the read wordline driver 430, the NFET pulldown device 910 is driven by a pulse generator 920. The pulse generator 920 only activates the hit bitline attached NFET pulldown device 910 in the case of a CAM side match, i.e. a hit being detected in the corresponding wordline. The pulse itself has a width that is adjustable independent of the data processing device's operational frequency and is set to best service multi-hit detection.

For example, as the number of wordlines, or rows, in the associative memory increases, the capacitance of the hit bitline would also increase. This would require a longer duration of time during which the NFET pulldown device 910 can discharge the hit bitline. The inverse would be true if the NFET strength increases or if the associative memory were to decrease in wordlines or rows. The pulse width generated by the pulse generator 920 may be adjusted correspondingly to an appropriate level to compensate for such changes.

It should be appreciated that the modifications shown in FIG. 9 are only exemplary of the possible modifications that may be made without departing from the spirit and scope of the present invention. Other modifications will become apparent to those of ordinary skill in the art in view of the description set forth herein. Such modifications are intended to be within the scope of the present description and the claims set forth hereafter.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then be integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing device, for detecting a multiple hit condition in an associative memory, comprising:
   precharging a hit bitline associated with the associative memory to a high voltage level;
   adjusting a voltage of the hit bitline with each determined match of compare data to data stored in wordlines of the associative memory; and
   detecting a multiple hit condition in the associative memory when the voltage of the hit bitline has a predetermined relationship with a threshold voltage, wherein the threshold voltage is a threshold voltage of a multi-hit detection inverter, coupled to the hit bitline, which inverts the voltage of the hit bitline to output a high state multi-hit signal in response to the voltage of the hit bitline being equal to or lower than the threshold voltage of the multi-hit detection inverter.

2. The method of claim 1, further comprising:
   providing the compare data to the associative memory;
   comparing the compare data to data stored in each wordline of the associative memory;

outputting a signal to access a secondary storage table memory for wordlines in which the compare data matches the data stored in the wordline; and reducing the voltage of the hit bitline with each determined match of the compare data to the data stored in the wordline.

3. The method of claim 2, wherein the voltage of the hit bitline is reduced by way of one or more transistors coupled to wordlines of the associative memory and the hit bitline.

4. The method of claim 3, further comprising:

independently modulating a duration for which a transistor in the one or more transistors is active.

5. The method of claim 4, wherein the duration for which the transistor is independently modulated is controlled by way of a pulse generator.

6. The method of claim 3, further comprising:

adjusting the threshold voltage to compensate for PVT affects of the one or more transistors coupled to the wordlines and the hit bitline.

7. The method of claim 6, wherein the threshold voltage is adjusted using at least one inverter.

8. The method of claim 1, further comprising:

invalidating data read from a secondary storage table memory in response to detecting the multiple hit condition in the associative memory.

9. The method of claim 1, further comprising:

invalidating wordlines in the associative memory that contribute to the multiple hit condition in response to detecting the multiple hit condition in the associative memory.

10. The method of claim 1, further comprising:

adjusting the threshold voltage of the multi-hit detection inverter to compensate for process-voltage-temperature (PVT) variations by adjusting inputs from a set of PFET devices and NFET devices coupled to the multi-hit detection inverter.

11. An apparatus, comprising an array of memory cells;

a hit bitline coupled to the array of memory cells; and a multi-hit detection inverter coupled to the hit bitline, wherein:

the hit bitline is precharged to a high voltage level, a voltage of the hit bitline is adjusted with each determined match of compare data to data stored in wordlines of the array of memory cells, and a multiple hit condition is detected in the array of memory cells when the voltage of the hit bitline has a predetermined relationship with a threshold voltage, wherein the threshold voltage is a threshold voltage of the multi-hit detection inverter which inverts the voltage of the hit bitline to output a high state multi-hit signal in response to the voltage of the hit bitline being equal to or lower than the threshold voltage of the multi-hit detection inverter.

12. The apparatus of claim 11, wherein:

the compare data is provided to the array of memory cells, the compare data is compared to data stored in each wordline of the array of memory cells;

a signal to access a secondary storage table memory for wordlines in which the compare data matches the data stored in the wordline is output; and the voltage of the hit bitline is reduced with each determined match of the compare data to the data stored in the wordline.

13. The apparatus of claim 12, wherein the voltage of the hit bitline is reduced by way of one or more transistors coupled to wordlines of the array of memory cells and the hit bitline.

14. The apparatus of claim 13, wherein a duration for which a transistor in the one or more transistors is active is independently modulated.

15. The apparatus of claim 14, wherein the duration for which the transistor is independently modulated is controlled by way of a pulse generator.

16. The apparatus of claim 13, wherein the threshold voltage is adjusted to compensate for PVT affects of the one or more transistors coupled to the wordlines and the hit bitline.

17. The apparatus of claim 16, wherein the threshold voltage is adjusted using at least one inverter.

18. The apparatus of claim 11, wherein data read from a secondary storage table memory is invalidated in response to detecting the multiple hit condition in the array of memory cells.

19. The apparatus of claim 11, wherein wordlines in the array of memory cells that contribute to the multiple hit condition are invalidated in response to detecting the multiple hit condition in the array of memory cells.

20. The apparatus of claim 11, further comprising:

a set of PFET devices and NFET devices coupled to the multi-hit detection inverter, wherein the set of PFET devices and NFET devices operate to adjust the threshold voltage of the multi-hit detection inverter to compensate for process-voltage-temperature (PVT) variations.

* * * * *